(12) United States Patent
Kim

(10) Patent No.: US 6,329,841 B1
(45) Date of Patent: Dec. 11, 2001

(54) LEVEL-SHIFTER FOR EXTREMELY LOW POWER SUPPLY

(75) Inventor: Yong K. Kim, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/517,083

(22) Filed: Mar. 2, 2000

(51) Int. Cl.$^7$ .................. H03K 19/094; H03K 19/0175
(52) U.S. Cl. .................. 326/68; 326/63; 326/80; 326/83
(58) Field of Search ................ 326/63, 68, 74, 326/80, 81, 82, 83

(56) References Cited

U.S. PATENT DOCUMENTS

| | | | |
|---|---|---|---|
| 4,574,273 | 3/1986 | Atsomi et al. | |
| 5,136,190 | * 8/1992 | Chern et al. | 326/81 |
| 5,266,848 | 11/1993 | Nakagome et al. | |
| 5,321,324 | * 6/1994 | Hardee et al. | 326/62 |
| 5,465,069 | * 11/1995 | Boiron et al. | 327/333 |
| 5,602,495 | 2/1997 | Lou. | |
| 5,646,550 | 7/1997 | Campball, Jr. et al. | |
| 5,666,070 | * 9/1997 | Merritt et al. | 326/81 |
| 5,811,990 | * 9/1998 | Blodgett et al. | 326/81 |
| 5,966,030 | * 10/1999 | Schmitt et al. | 326/83 |
| 6,064,229 | * 5/2000 | Morris | 326/81 |

FOREIGN PATENT DOCUMENTS

5308274-A * 11/1993 (JP) ..................... 326/81

* cited by examiner

Primary Examiner—Michael Tokar
Assistant Examiner—Steven S. Paik
(74) Attorney, Agent, or Firm—Davis Chin

(57) ABSTRACT

An improved level shifter circuit is provided which is designed for use with an extremely low power supply voltage. The level shifter circuit includes a fourth NMOS transistor, a third PMOS transistor, and a fifth NMOS transistor connected in series and interconnected between the high voltage and the output terminal. As a result, the high voltage will still be passed to the output terminal when the high voltage is lowered to be equal to the low power supply voltage.

9 Claims, 1 Drawing Sheet

LEVEL-SHIFTER FOR EXTREMELY LOW POWER SUPPLY

BACKGROUND OF THE INVENTION

This invention relates generally to level shifter circuitry and more particularly, it relates to an improved level shifter circuit for use with an extremely low power supply voltage.

As is generally well-known, digital logic circuits are widely used in the areas of electronics and computer-type equipment. However, the various digital logic circuits that must communicate with one another may have different power supply voltages. For example, a first circuit that operates with logic levels between 0 V (L) and 2.0 V (H) may need to communicate with a second circuit that operates with logic levels between 0 V (L) and 3.3 V (H). Thus, when a first digital logic circuit of one power supply voltage is required to interface with a second digital logic circuit of another power supply voltage there is typically needed a voltage conversion or translation between the two different power supplies so that they will be compatible with each other and not drain static current. A level shifter circuit is provided to perform this function.

In FIG. 1, there is shown a schematic circuit diagram of a prior art level shifter circuit 10 which may be used to perform a voltage conversion. The level shifter circuit 10 is comprised of a pass N-channel MOS transistor N1; pull-up P-channel MOS transistors P1, P2; and pull-down N-channel MOS transistors N4, N5. The first P-channel transistor P1 has its source connected to the source of the second P-channel transistor P2 and to a high voltage HV, which is typically at approximately VCC−+10 volts The drain of the transistor P1 is connected to the gate of the transistor P2 and to the source of the pass transistor N1. The gate of the transistor P1 is connected to the drain of the transistor P2 at a node A, which is connected to an output terminal OUT.

The pass transistor N1 has its drain connected to an input terminal IN for receiving an input signal and to the gate of the pull-down transistor N5. The gate of the transistor N1 is connected to a first power supply potential VCC, which is typically at +2.0 V. The pull-down transistor N4 has its drain connected also to the node A and to the output terminal OUT. The pull-down transistor N5 has its drain connected to the source of the transistor N4 and its source connected to a second power supply or ground potential VSS (zero volts). The n-type substrate of the P-channel transistors P1, P2 is tied to its source and to the high voltage NV.

In operation, when the input signal at the input terminal IN is at 0 volts the pull-up transistor P2 will be turned ON and the transistors P1 and N5 will both be turned OFF. As a result, the level shifter circuit 10 will produce a voltage level of HV (i.e., +9 V) at the output terminal OUT. On the other hand, when the input signal at the input terminal IN is at VCC (i.e., 2.0 V), the transistors N5 and P1 will both be turned ON and the transistor P2 will be turned OFF. Thus, the level shifter circuit 10 will provide a voltage level of 0 volts at the output terminal OUT.

However, this existing prior art level shifter circuit 10 suffers from the principal disadvantage that it will fail or not operate when the power supply voltage VCC is reduced down to an extremely low voltage, such as +1.0 volts which is equivalent to the threshold voltage of the P-channel MOS transistors P1, P2 and HV=VCC. In view of the trend for deep-submicron CMOS technology, lower and lower power supply voltages VCC are being used. Thus, as the power supply voltage VCC is made lower to be near or below the threshold voltage of the P-channel transistors P1, P2 and the high voltage HV is made to be equal to the supply potential VCC, neither of the pull-up transistors P1 or P2 will be able to be turned ON and consequently, the node A or output terminal OUT will be left floating.

Further, as the thickness of the gate oxides for forming the CMOS transistors are being made thinner and thinner in the CMOS technology, such as 60 Å (angstrom) or below, a voltage difference higher than about +2.4 V−+2.5 V applied across the gate and the bulk of the transistor device will cause a breakdown in the gate oxide to occur, thereby creating a failure. For example, when the input signal of 0 volts is applied to the gate of the transistor P2 in FIG. 1, the level shifter circuit 10 will generate a voltage level of HV volts at the output terminal OUT. As will, be noted, there will be created a voltage difference of HV between the drains and the gates of the P-channel transistors P1, P2. If the transistors P1, P2 were made of thin oxide; this will cause a breakdown of the thinner gate oxides.

Therefore, it would be desirable to provide an improved level shifter circuit which is designed to be capable of operating with an extremely low power supply voltage. Further, it would be expedient that the level shifter circuit be able to prevent the breakdown of the gate oxide in all of the transistors.

SUMMARY OF THE INVENTION

Accordingly, it is a general object of the present invention to provide an improved level shifter circuit for use with an extremely low power supply voltage which has been traditionally unavailable.

It is an object of the present invention to provide an improved level shifter circuit which is designed to operate with an extremely low power supply voltage.

It is another object of the present invention to provide an improved level shifter circuit which prevents the breakdown of the gate oxide in all of the transistors.

It is still another object of the present invention to provide an improved level shifter circuit which includes a secondary path circuit for passing a high voltage to an output terminal when the high voltage is lowered to be equal to a power supply voltage of +1.0 volts.

In a preferred embodiment of the present invention, there is provided a level shifter circuit for use with an extremely low power supply voltage which includes an input terminal for receiving an input signal having first and second levels and an output terminal for providing an output signal having third and fourth levels. There is provided a first power supply voltage having the extremely low power supply voltage, a second power supply voltage having a ground potential, and a third power supply voltage having a high voltage.

There is provided first and second PMOS transistors. The first PMOS transistor has its source connected to the source of the second PMOS transistor, its drain connected to the gate of the second PMOS transistor at an internal node, and its gate connected to the drain of the second PMOS transistor and to the output terminal.

There are provided first and second NMOS transistors. The first NMOS transistor has its drain connected to the drain of the second PMOS transistor and to the output terminal. The first NMOS transistor has its source connected to the drain of the second NMOS transistor and its gate connected to the first power supply voltage. The second NMOS transistor has its gate connected to receive the input signal and its source connected to the ground potential. A third NMOS transistor has its drain connected to the input terminal, its gate connected to the first power supply voltage, and its source connected to the internal node.

A secondary path circuit is responsive to the input signal for transferring the high voltage to the output terminal when the high voltage is lowered to be equal to the first power supply voltage. The secondary path circuit includes a fourth NMOS transistor, a third PMOS transistor, and a fifth NMOS transistor connected in series and interconnected between the high voltage and the output terminal and an inverter.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
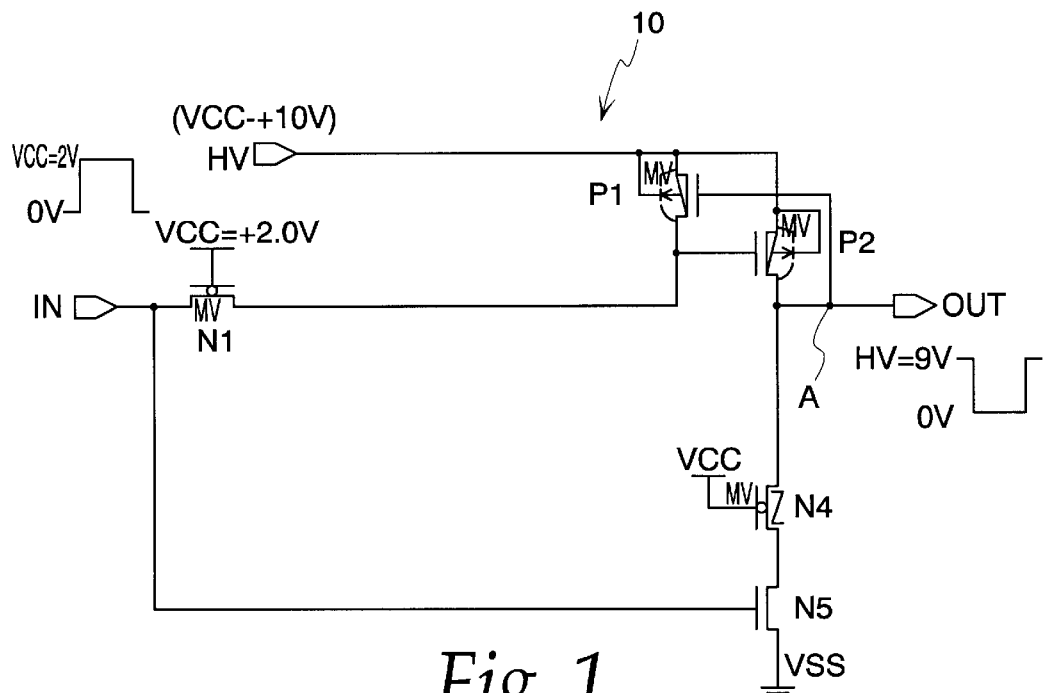
FIG. 1 is a schematic circuit diagram of a prior art level shifter circuit.
Figure 2:
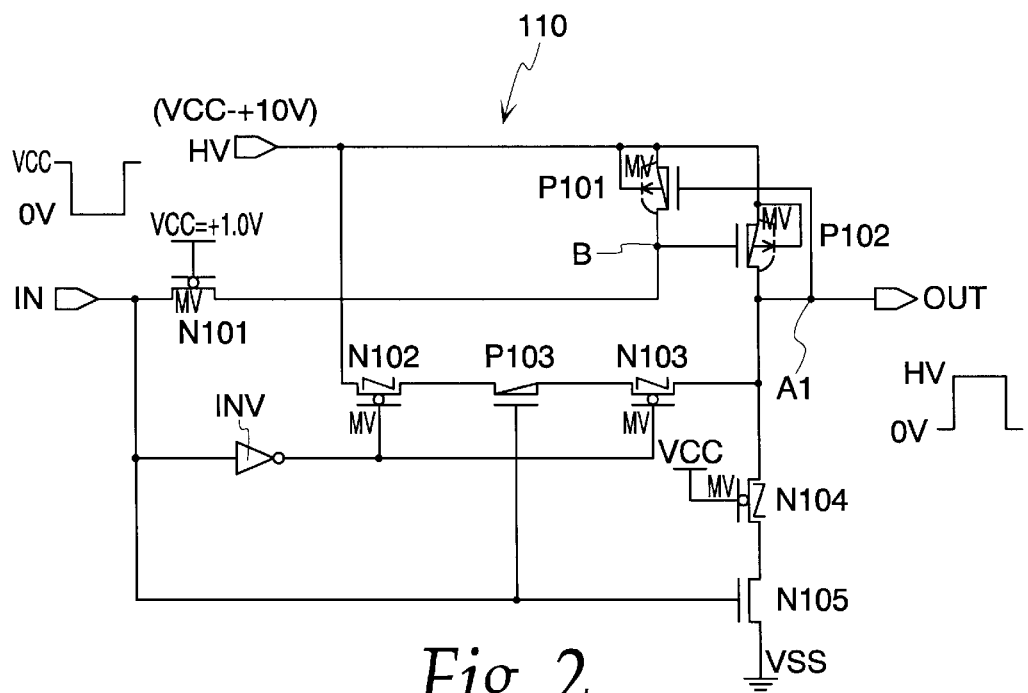
FIG. 2 is a schematic circuit diagram of an improved level shifter circuit, constructed in accordance with the principles of the present invention.

Referring now to FIG. 2 of the drawings, there is shown a schematic circuit diagram of an improved level shifter circuit 110 constructed in accordance with the principles of the present invention. The level shifter circuit 110 is used to convert logic signals from a core device (e.g., microprocessor) having voltage levels of low and high (0 V and VCC=+1.0 V) to higher input/output (I/O) voltage levels of a high voltage HV (e.g., VCC-+10 V) and 0 V. The inverting level shifter 110 represents an improvement over the level shifter 10 of FIG. 1 which is still functional at the extremely low power supply potential of +1.0 volts.

The level shifter circuit 110 is comprised of a pass N-channel MOS transistor N101; pull-up P-channel MOS transistors P101, P102; and pull-down N-channel MOS transistors N104, N105. In particular, the first P-channel transistor P101 has its source connected to the source of-the second P-channel transistor P102 and to a high voltage HV, which is typically at approximately VCC-+10 volts. The drain of the transistor P101 is connected to the gate of the transistor P102 at an internal node B and to the source of the pass transistor N101. The gate of the transistor P101 is connected to the drain of the transistor P102 at a node A1, which is connected to an output terminal OUT.

The pass transistor N101 has its drain connected to an input terminal IN for receiving an input signal and to the gate of the pull-down transistor N105. The gate of the transistor N101 is connected to a first power supply potential VCC, which is typically at +1.0 volts. The pull-down transistor N104 has its drain connected also to the node Al and to the output terminal OUT. The pull-down transistor N105 has its drain connected to the source of the transistor N104 and its source connected to a second power supply or ground potential VSS (zero volts). The n-type substrate of the P-channel transistors P101, P102 is tied to its source and to the high voltage HV. As thus far described, the elements of FIG. 2 and their interconnection are identical to the components in the level shifter circuit 10 of FIG. 1.

In addition to these elements, the level shifter circuit 110 of the present invention further includes a secondary path circuit formed by pass N-channel MOS transistors N102, N103; pass P-channel MOS transistor P103; and a CMOS inverter INV. The NMOS transistor N102 has its drain also connected to the source of the transistor P101 to receive the high voltage HV and its source connected to the source of the PMOS transistor P103. The NMOS transistor N103 has its drain connected to the drain of the PMOS transistor P103 and its source connected also to the node A1. The gate of the transistor P103 is connected to the drain of the transistor N101 and receives the input signal IN. The gates of the transistors N102 and N103 are connected together and to the output of the inverter INV. The input of the inverter INV is connected also to the drain of the transistor N101 and receives the input signal IN. The CMOS inverter INV is a conventional inverter and is formed of a P-channel transistor and an N-channel transistor whose gates are connected together defining its input and whose drains are connected together defining its output.

Unlike the prior art of FIG. 1, the level shifter circuit 110 of the present invention has a second pull-up path through the transistors N102, P103 and N103 instead of a single pull-up path through the transistor P2 of FIG. 1. Since the high voltage HV is approximately VCC-+10 volts, the transistors N102, N103 are made of a thicker gate oxide so as to be able to withstand a drain-to-gate voltage of +10 V. Further, the transistors N102, N103 are depletion-type transistors whose values of the threshold voltage $V_{tn}$, including the body effect, are equal to approximately 0 volts.

The transistor P103 is made of a thinner gate oxide (e.g., 60 Å) so as to have a lower threshold voltage in order to be operational, but will not be capable of handling the high voltage HV due to the oxide breakdown. Thus, the transistor P103 is sandwiched or connected in series between the NMOS transistors N102, N103 which function to protect the gate oxide of the transistor P103 under the situation when the high voltage HV exceeds the first (low) power supply potential VCC. The absolute value of the threshold voltage $V_{tp}$, including the body effect, is equal to approximately one-half of the first power supply potential VCC.

The operation of the level shifter circuit 110 will now be explained for the condition when the first (low) power supply potential VCC is equal to +1.0 V and the high voltage HV is equal to the first (low) power supply voltage. When the input signal at the input terminal IN is high or at VCC, the pull-down transistor N105 will be turned ON so as to pull the node A1 to the ground potential. Thus, the voltage level will be 0 volts at the output terminal OUT. It will be noted that only the transistor P102 will be turned OFF since the transistors N102 and N103 are of the depletion-type.

When the input signal IN switches from VCC to 0 V, the transistor N105 will be turned OFF and all of the transistors N102, P103, N103 will be turned ON. As a result, the high voltage HV will be passed via these transistors to the node A1 and the voltage of HV (VCC) will be produced at the output terminal OUT.

From the foregoing detailed description, it can thus be seen that the present invention provides an improved level shifter circuit which includes a second pull-up path for transferring or connecting the high voltage to the output terminal when the high voltage is lowered to be equal to the power supply voltage. The level shifter circuit of the present invention includes a secondary path circuit formed of a fourth NMOS transistor, a third PMOS transistor, and a fifth NMOS transistor connected in series and interconnected between the high voltage and the output terminal. As a result, the level shifter circuit will still operate when the power supply voltage VCC is reduced down to an extremely low power supply voltage of +1.0 volts.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A level shifter circuit for use with an extremely low power supply voltage, said level shifter circuit comprising:

an input terminal for receiving an input signal having first and second levels;

an output terminal for providing an output signal having third and fourth levels;

a first power supply voltage having the extremely low power supply voltage;

a second power supply voltage having a ground potential;

a third power supply voltage having a high voltage;

first and second PMOS transistors, said first PMOS transistor having its source connected to the source of said second PMOS transistor, its drain connected to the gate of said second PMOS transistor at an internal node, and its gate connected to the drain of said second PMOS transistor and to said output terminal;

first and second NMOS transistors, said first NMOS transistor having its drain connected to the drain of said second PMOS transistor and to said output terminal, said first NMOS transistor having its source connected to the drain of said second NMOS transistor and its gate connected to the first power supply voltage, said second NMOS transistor having its gate connected to receive said input signal and its source connected to the ground potential;

a third NMOS transistor having its drain connected to said input terminal, its gate connected to said first power supply potential, and its source connected to the internal node;

means responsive to said input signal for passing said high voltage to said output terminal when said high voltage is lowered to be equal to said first power supply voltage;

said means for passing said high voltage including a fourth NMOS transistor, a third PMOS transistor, and a fifth NMOS transistor connected in series and interconnected between said high voltage and said output terminal, and an inverter; and said fourth NMOS transistor having its drain connected to said high voltage, its source connected to the source of said third PMOS transistor, and its gate connected to the output of said inverter, said third PMOS transistor having its drain connected to the drain of said fifth NMOS transistor and its gate connected to said input terminal, said fifth NMOS transistor having its source connected to said output terminal and its gate connected to the gate of said fourth NMOS transistor, said inverter having its input connected to said input terminal.

2. A level shifter circuit as claimed in claim 1, wherein said first low power supply voltage is approximately +1.0 volts.

3. A level shifter circuit as claimed in claim 2, wherein said high voltage is approximately +8–+10 volts.

4. A level shifter circuit as claimed in claim 3, wherein said first and second levels are respective voltage levels of zero volts and the low power supply voltage.

5. A level shifter circuit as claimed in claim 4, wherein said third and fourth levels are respective voltages of the high voltage and zero volts.

6. A level shifter circuit as claimed in claim 5, wherein said fourth and fifth NMOS transistors are depletion-type transistors.

7. A level shifter circuit as claimed in claim 6, wherein said fourth and fifth NMOS transistors serve to protect the gate oxide of said third PMOS transistor when said high voltage exceeds said low power supply voltage.

8. A level shifter circuit as claimed in claim 1, wherein said fourth and fifth NMOS transistors are depletion-type transistors.

9. A level shifter circuit as claimed in claim 8, wherein said fourth and fifth NMOS transistors serve to protect the gate oxide of said third PMOS transistor when said high voltage exceeds said low power supply voltage.

* * * * *

UNITED STATES PATENT AND TRADEMARK OFFICE
CERTIFICATE OF CORRECTION

PATENT NO. : 6,329,841 B1
DATED : December 11, 2001
INVENTOR(S) : Yong K. Kim

Page 1 of 1

It is certified that error appears in the above-identified patent and that said Letters Patent is hereby corrected as shown below:

Column 1,
Line 48, change "NV" to-- HV --.

Column 2,
Line 15, change "As will," to -- As will --
Line 18, change ";" to -- , --.

Signed and Sealed this

Twenty-eighth Day of May, 2002

Attest:

JAMES E. ROGAN
Attesting Officer   Director of the United States Patent and Trademark Office